(12) United States Patent
Hatasa et al.

(10) Patent No.: US 10,157,815 B2
(45) Date of Patent: Dec. 18, 2018

(54) SEMICONDUCTOR DEVICE

(71) Applicant: Toyota Jidosha Kabushiki Kaisha, Toyota-shi, Aichi-ken (JP)

(72) Inventors: Keita Hatasa, Miyoshi (JP); Makoto Imai, Toyota (JP); Tomomi Okumura, Kariya (JP)

(73) Assignee: Toyota Jidosha Kabushiki Kaisha, Toyota-shi (JP)

( * ) Notice: Subject to any disclaimer, the term of this patent is extended or adjusted under 35 U.S.C. 154(b) by 0 days.

(21) Appl. No.: 15/367,386

(22) Filed: Dec. 2, 2016

(65) Prior Publication Data

US 2017/0162462 A1 Jun. 8, 2017

(30) Foreign Application Priority Data

Dec. 4, 2015 (JP) ................................. 2015-237927

(51) Int. Cl.
*H01L 23/31* (2006.01)
*H01L 23/367* (2006.01)
(Continued)

(52) U.S. Cl.
CPC ...... *H01L 23/3675* (2013.01); *H01L 23/3121* (2013.01); *H01L 24/32* (2013.01);
(Continued)

(58) Field of Classification Search
CPC ....... H01L 2224/48091; H01L 2924/14; H01L 23/3107; H01L 23/42; H01L 2924/1815;
(Continued)

(56) References Cited

U.S. PATENT DOCUMENTS

2005/0230816 A1* 10/2005 Kurauchi ............ H01L 23/3107
257/706
2007/0052072 A1* 3/2007 Iwade ................... H01L 23/051
257/675
(Continued)

FOREIGN PATENT DOCUMENTS

| JP | 2005-310987 A | 11/2005 |
| JP | 2008-210829 A | 9/2008 |
| JP | 2015-095560 A | 5/2015 |

*Primary Examiner* — Frederick B Hargrove
(74) *Attorney, Agent, or Firm* — Dinsmore & Shohl LLP

(57) ABSTRACT

A semiconductor device includes: a sealing body that seals a first semiconductor element and a second semiconductor element; first heat-radiating members exposed at a front surface of the sealing body; second heat-radiating members exposed at a back surface of the sealing body; first signal terminals electrically connected to the first semiconductor element, and projecting from a top surface of the sealing body in a first direction; and second signal terminals electrically connected to the second semiconductor elements, and projecting from the top surface of the sealing body in the first direction. The top surface of the sealing body includes a first inclined surface, a second inclined surface, and a boundary line or a boundary range located therebetween. The boundary line or the boundary range includes at least part of a minimum creepage path between the first signal terminals and the second signal terminals.

11 Claims, 13 Drawing Sheets

(51) Int. Cl.
  *H01L 23/00*    (2006.01)
  *H01L 25/11*    (2006.01)

(52) U.S. Cl.
  CPC ............ *H01L 24/33* (2013.01); *H01L 24/48* (2013.01); *H01L 24/73* (2013.01); *H01L 25/117* (2013.01); *H01L 2224/04042* (2013.01); *H01L 2224/291* (2013.01); *H01L 2224/32245* (2013.01); *H01L 2224/33181* (2013.01); *H01L 2224/48091* (2013.01); *H01L 2224/48247* (2013.01); *H01L 2224/73215* (2013.01); *H01L 2224/73265* (2013.01); *H01L 2924/13055* (2013.01); *H01L 2924/13091* (2013.01)

(58) Field of Classification Search
  CPC .. H01L 23/367; H01L 23/3675; H01L 25/072
  See application file for complete search history.

(56) References Cited

U.S. PATENT DOCUMENTS

2012/0001308 A1*  1/2012  Fukutani ........... H01L 23/49524
                                                           257/675
2015/0162274 A1*  6/2015  Kadoguchi ........... H01L 23/047
                                                           257/694

* cited by examiner

SEMICONDUCTOR DEVICE

CROSS-REFERENCE TO RELATED APPLICATIONS

This application claims priority to Japanese Patent Application No. 2015-237927 filed on Dec. 4, 2015, which is incorporated herein by reference in its entirety including the specification, drawings and abstract.

BACKGROUND

1. Technical Field

A disclosure in the present specification relates to a semiconductor device.

2. Description of Related Art

A semiconductor device is disclosed in Japanese Patent Application Publication No. 2015-095560. This semiconductor device includes a first semiconductor element, a second semiconductor element, a sealing body that seals the first semiconductor element and the second semiconductor element, first heat-radiating members exposed at a front surface of the sealing body, second heat-radiating members exposed at a back surface of the sealing body, and plural first signal terminals and plural second signal terminals that project from the top surface of the sealing body. Each of the first heat-radiating members and the second heat-radiating members are configured by a material having a higher thermal conductivity than that of a material configuring the sealing body so as to radiate heat generated in the sealing body to the outside of the sealing body.

The above semiconductor device is disposed between two cooling units. One of the cooling units is disposed on the front surface side of the sealing body, and is in contact with the first heat-radiating member exposed at this front surface. The other of the cooling units is disposed on the back surface side of the sealing body, and is in contact with the second heat-radiating member exposed at this back surface. Accordingly, heat from the first heat-radiating member and the second heat-radiating member is collected by the two cooling units, thereby preventing over heat in components such as the first semiconductor element and the second semiconductor element inside the sealing body. Usually, gaps between the respective cooling units and the sealing body (including the heat-radiating members) are filled with grease so as to eliminate fine voids, thereby enhancing the thermal conductivity.

SUMMARY

If the semiconductor device generates heat during its operation, components of the semiconductor device expand with the heat, and an outer shape of the sealing body becomes increased. If the outer shape of the sealing body becomes increased, grease is squeezed out between the sealing body and cooling units, so that this grease might flow toward a top surface of the sealing body. The first signal terminals connected to the first semiconductor element and the second signal terminals connected to the second semiconductor element respectively project from the top surface of the sealing body. Because the first semiconductor element and the second semiconductor element are connected in series to each other, a relatively great potential difference can be generated between the first signal terminals and the second signal terminals. In usual, a sufficient creepage distance is provide between the first signal terminals and the second signal terminals so as to secure electric insulation therebetween. The above creepage distance denotes a length of a minimum creepage path defined by connecting the first signal terminals and the second signal terminals along a surface (top surface) of the sealing body in a shortest distance. However, the grease having flowed to the top surface of the sealing body expands to the minimum creepage path between the first signal terminals and the second signal terminals, and if electrically-conductive foreign substances, such as metallic powders, adhere to the grease, this adhesion probably deteriorates the electric insulation between the first signal terminals and the second signal terminals.

The present disclosure provides a semiconductor device that is disposed between each two adjacent cooling units via grease, and is capable of preventing or reducing deterioration of electric insulation between signal terminals by the grease.

A semiconductor device according to one aspect of the present disclosure includes: a first semiconductor element; a second semiconductor element electrically connected in series to the first semiconductor element: a sealing body sealing the first semiconductor element and the second semiconductor element; first heat-radiating members exposed at a front surface of the sealing body, the first heat-radiating members configured by a material having a higher thermal conductivity than that of a material configuring the sealing body; second heat-radiating members exposed at a back surface of the sealing body located on an opposite side to the front surface of the sealing body, the second heat-radiating members configured by a material having a higher thermal conductivity than that of the material configuring the sealing body; at least one first signal terminal electrically connected to the first semiconductor element, the first signal terminal projecting from a top surface adjacent to the front surface and the back surface of the sealing body along a first direction; and at least one second signal terminal electrically connected to the second semiconductor element, the second signal terminal projecting from the top surface of the sealing body along the first direction. The top surface of the sealing body includes: a first inclined surface; a second inclined surface; and a boundary line or a boundary range located between the first inclined surface and the second inclined surface. The boundary line or the boundary range includes at least part of a minimum creepage path between the first signal terminal and the second signal terminal. If the first direction (i.e., a direction in which the first and the second signal terminals project) is directed to a vertically upward direction, each of the first inclined surface and the second inclined surface is inclined in a vertically downward direction from the boundary line or the boundary range toward a circumferential edge of the top surface.

In the above aspect, the front surface, the back surface, the top surface, the right surface, and the left surface of the sealing body are expressions for convenience of explanation to clarify a relative positional relation among them, and no limitation is intended except for the above described matters. The expression that the boundary line or the boundary range includes at least part of the minimum creepage path denotes that the boundary line or the boundary range includes at least one point on the minimum creepage path, and for example, this also includes a case in which the boundary line or the boundary range intersects the minimum creepage path. With respect to the above boundary line or the boundary range, the boundary line means a line segment defining a boundary between a first inclined surface and a second inclined surface if the first inclined surface and the second inclined surface are adjacent to each other. Meanwhile, the boundary range means a plane segment present between the first inclined surface and the second inclined surface if the first inclined surface and the second inclined surface are apart from each other. A vertically upward direction means an opposite direction to a gravitational acceleration direction, and a vertically downward direction means the same direction as the gravitational acceleration direction.

The aforementioned semiconductor device is supposed to be disposed between two cooling units in such a manner that a projecting direction (i.e., the aforementioned first direction) of the first and the second signal terminals from the sealing body is directed to a vertically upward direction. As aforementioned, if the semiconductor device is disposed between the two cooling units, the grease between the sealing body and each cooling unit is squeezed out due to deformation of the outer shape of the sealing body, so that this grease might flow to the top surface (i.e., the surface from which the first and the second signal terminals project) of the sealing body. With respect to this point, in the semiconductor device disclosed herein, the top surface of the sealing body is configured to include the first inclined surface and the second inclined surface. The boundary line or the boundary range between the first inclined surface and the second inclined surface includes at least part of the minimum creepage path between the first signal terminal and the second signal terminal. According to this configuration, the grease having flowed to the top surface of the sealing body flows along the first inclined surface or the second inclined surface in a manner as to be apart from the minimum creepage path between the first signal terminal and the second signal terminal. Through this, the grease having flowed to the top surface of the sealing body is prevented from arriving at the minimum creepage path between the first signal terminal and the second signal terminal, thereby maintaining electric insulation between the first signal terminal and the second signal terminal. Each inclination angle of the first inclined surface and the second inclined surface may be appropriately designed in consideration of a viscosity of the grease, affinity between the grease and the sealing body, and others. In the case in which the semiconductor device is installed in an automobile or the like, flow of the grease is promoted by vibrations generated by the automobile, and thus each inclination angle of the first inclined surface and the second inclined surface can be designed to be relatively small.

BRIEF DESCRIPTION OF THE DRAWINGS

Features, advantages, and technical and industrial significance of exemplary embodiments will be described below with reference to the accompanying drawings, in which like numerals denote like elements, and wherein.

DETAILED DESCRIPTION OF EMBODIMENTS

Figure 1:
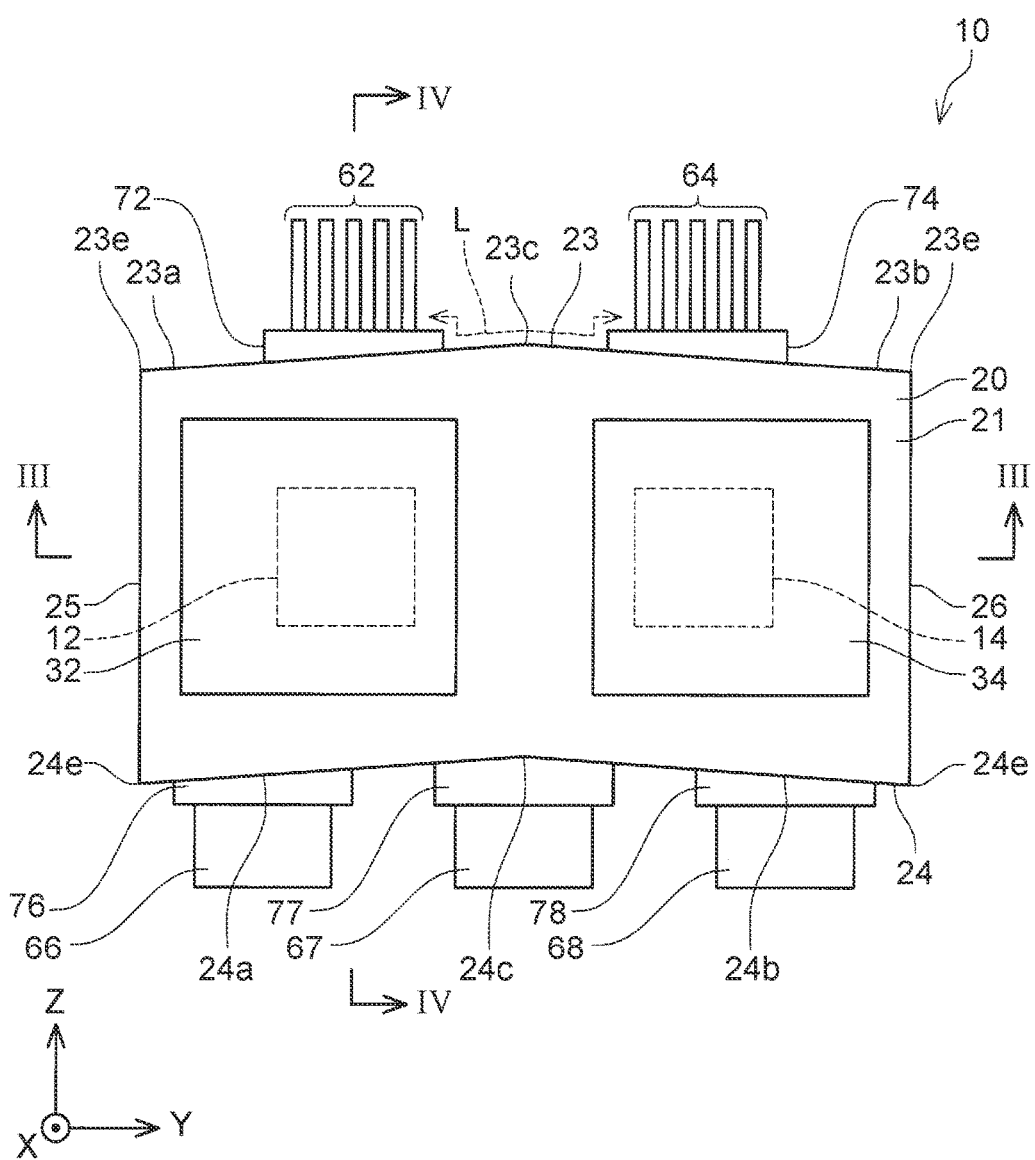
FIG. 1 is a front view of a semiconductor device of an embodiment.

With reference to drawings, a semiconductor device 10 of an embodiment will be described. As an example, the semiconductor device 10 of the present embodiment is used for an electric power converting apparatus 100 (see FIG. 6 and others) for converting and controlling electric power, and configures upper and lower arms of a kind of an inverter circuit. As shown in FIG. 1 to FIG. 5, the semiconductor device 10 includes a first semiconductor element 12, a second semiconductor element 14, and a sealing body 20 that seals the first semiconductor element 12 and the second semiconductor element 14. Each of the first semiconductor element 12 and the second semiconductor element 14 has an allowable current of 100 A or more, and belongs to a power semiconductor element. As shown in FIG. 5, the first semiconductor element 12 and the second semiconductor element 14 are electrically connected in series to each other. As an example, each of the first semiconductor element 12 and the second semiconductor element 14 is a semiconductor element configured by forming a transistor element and a diode element on a single semiconductor substrate, and both have the same structure and properties. Each configuration of the first semiconductor element 12 and the second semiconductor element 14 is not limited to a particular one. Each of the first semiconductor element 12 and the second semiconductor element 14 may be a transistor element, such as an insulated gate bipolar transistor (IGBT) and a metal-oxide-semiconductor field-effect transistor (MOSFET), or may not always incorporate a diode element therein.

The sealing body 20 is configured by a resin material. The material configuring the sealing body 20 is not limited to a particular one, and various types of sealing materials for power semiconductor elements may be employed. The sealing body 20 roughly has a platy shape, and includes a front surface 21, a back surface 22, a top surface 23, a bottom surface 24, a right surface 25, and a left surface 26. In the drawings, each arrow direction in an X axis, a Y axis, and a Z axis will be explained as a positive direction, and a direction opposite to each arrow direction will be explained as a negative direction. The front surface 21 corresponds to a surface located on an X-axis positive direction side in the drawing. The back surface 22 corresponds to a surface located on an X-axis negative direction side in the drawing, and located on an opposite side to the front surface 21. The top surface 23 corresponds to a surface located on a Z-axis positive direction side in the drawing, and adjacent to the front surface 21 and the back surface 22. The bottom surface 24 corresponds to a surface located on a Z-axis negative direction side in the drawing, and located on an opposite side to the top surface 23. The bottom surface 24 is adjacent to the front surface 21 and the back surface 22. The right surface 25 corresponds to a surface located on a Y-axis negative direction side in the drawing, and adjacent to the front surface 21, the back surface 22, the top surface 23, and the bottom surface 24. The left surface 26 corresponds to a surface located on a Y-axis positive direction side in the drawing, and located on an opposite side to the right surface 25. The left surface 26 is adjacent to the front surface 21, the back surface 22, the top surface 23, and the bottom surface 24.

Figure 8:
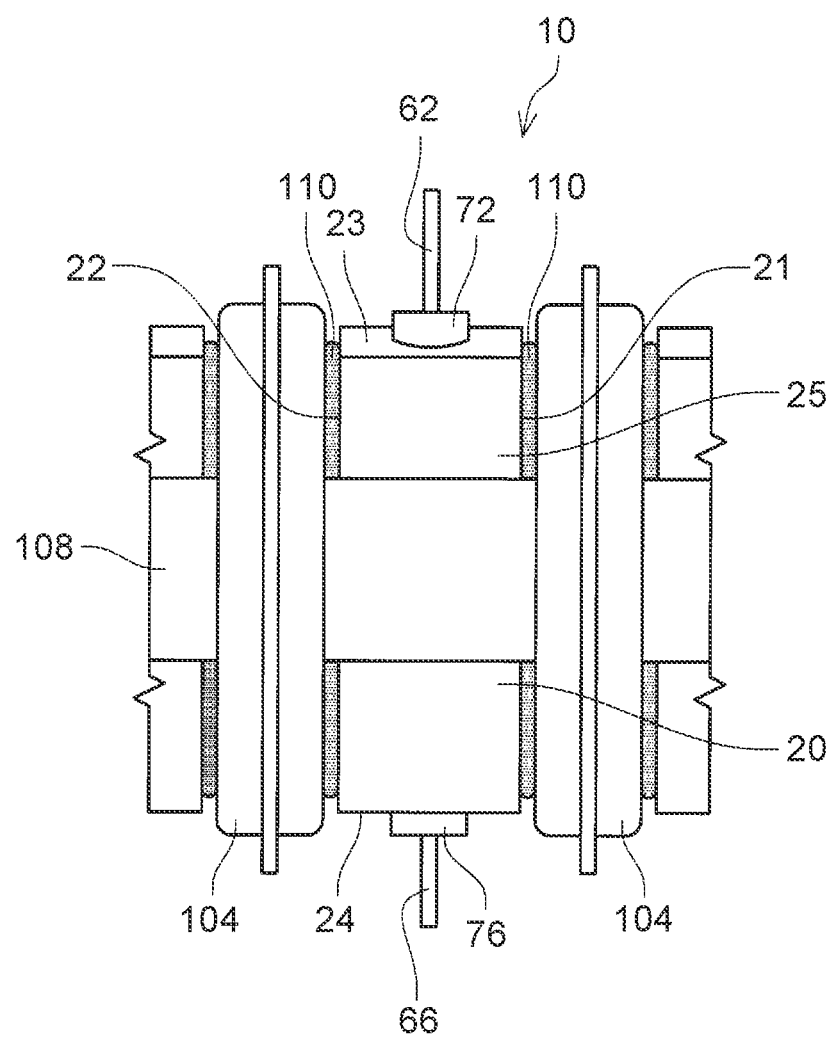
FIG. 8 is an enlarged view of a VIII part in FIG. 6.

The front surface 21 and the back surface 22 of the sealing body 20 are flat surfaces parallel with each other, and normal lines thereof are parallel with the X-axis. Although described in details later, if the semiconductor device 10 is disposed between two cooling units 104, the front surface 21 and the back surface 22 of the sealing body 20 are so disposed as to face corresponding adjacent cooling units 104 via grease 110, as shown in FIG. 8. Meanwhile, the top surface 23 of the sealing body 20 is not a single flat surface as a whole, but includes a first inclined surface 23a and a second inclined surface 23b, and a first projecting portion 72 and a second projecting portion 74. The bottom surface 24 is not a single flat surface as a whole, but includes a third inclined surface 24a and a fourth inclined surface 24b, and a third projecting portion 76 and a fourth projecting portion 77 and a fifth projecting portion 78. Configurations and operations of the top surface 23 and the bottom surface 24 of the sealing body 20 will be described in details in the following description.

Figure 3:
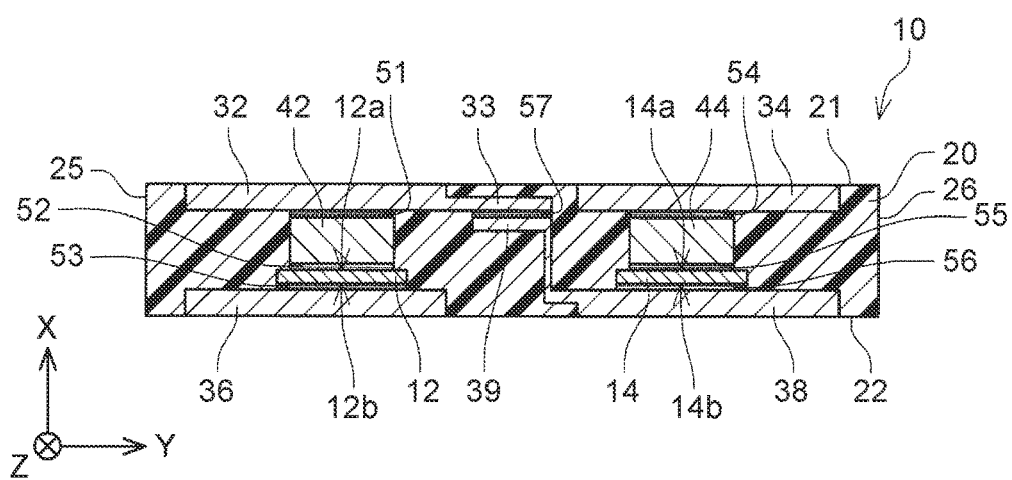
FIG. 3 is a sectional view taken along line III-III in FIG. 1.
Figure 4:
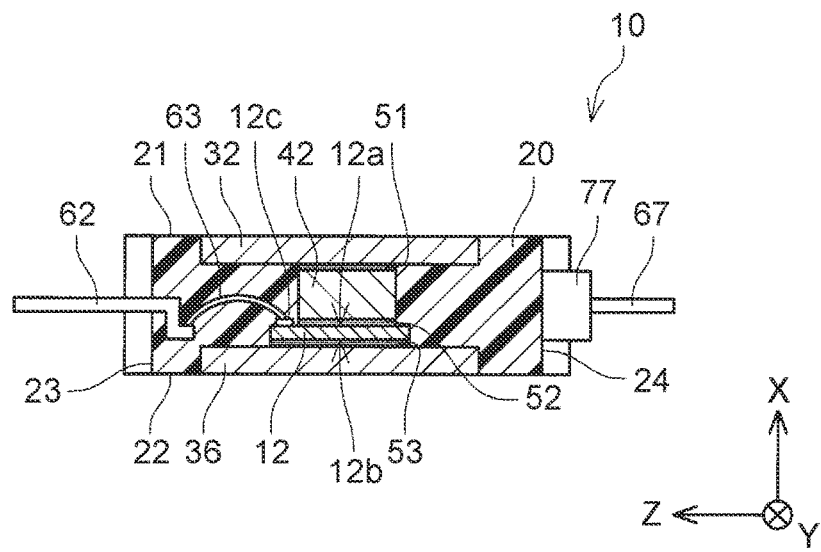
FIG. 4 is a sectional view taken along line IV-IV in FIG. 1.
Figure 5:
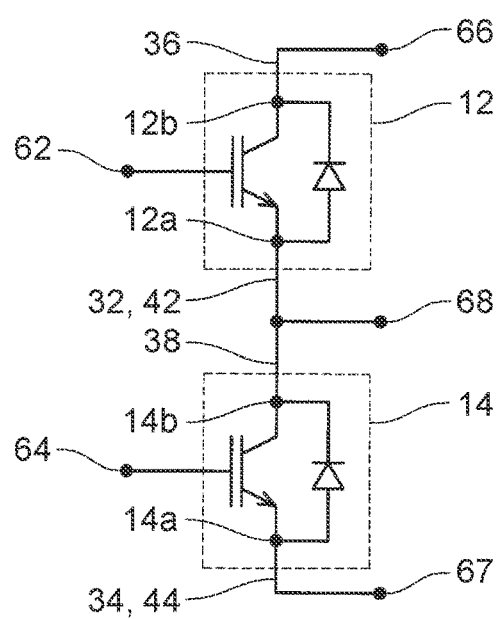
FIG. 5 is a circuit diagram showing a circuit configuration of the semiconductor of the embodiment.

As shown in FIG. 1, FIG. 3, and FIG. 4, the semiconductor device 10 further includes two first heat-radiating members 32, 34, and two second heat-radiating members 36, 38. The two first heat-radiating members 32, 34 are exposed at the front surface 21 of the sealing body 20. The two heat-radiating members 36, 38 are exposed at the back surface 22 of the sealing body 20. Each of the heat-radiating members 32, 34, 36, 38 is configured by a material having a higher thermal conductivity than that of a material configuring the sealing body 20 so as to radiate heat (particularly heat generated by the front surfaces 21, 14) generated inside the sealing body 20 to the outside of the sealing body 20. As an example, each of the heat-radiating members 32, 34, 36, 38 in the present embodiment is configured by a metallic material (specifically copper). The material configuring the heat-radiating members 32, 34, 36, 38 is not limited to a particular one. Part or all of the heat-radiating members 32, 34, 36, 38 may be configured by a material excellent in thermal conductivity, such as a ceramic material and others. Positions, dimensions, and the numbers of the heat-radiating members exposed at the front surface 21 or to the back surface 22 of the sealing body 20 are not limited to particular ones. The semiconductor device 10 may be configured such that at least one heat-radiating member is exposed at one or both of the front surface 21 and the back surface 22 of the sealing body 20.

With reference to FIG. 3, a configuration of an inside of the sealing body 20 will be described. The following description is merely an example, and it is not intended to limit the configuration of the semiconductor device 10. As shown in FIG. 3, the first heat-radiating member 32 that is one of the heat-radiating members in pair is joined to a top surface electrode 12a of the first semiconductor element 12 via a first spacer block 42 and solder layers 51, 52. The first spacer block 42 is formed by a metallic material (specifically copper), and has a higher thermal conductivity than that of the material configuring the sealing body 20. The second heat-radiating member 36 that is one of the heat-radiating members in pair is joined to a bottom surface electrode 12b of the first semiconductor element 12 via a solder layer 53. Through these components, the first semiconductor element 12 is thermally connected to both the first heat-radiating member 32 exposed at the front surface 21 of the sealing body 20 and the second heat-radiating member 36 exposed at the back surface 22 of the sealing body 20. Heat generated in the first semiconductor element 12 is transferred to the first heat-radiating member 32 and the second heat-radiating member 36, and is then radiated to the outside of the sealing body 20.

The same configuration is employed in the second semiconductor element 14. Specifically, the first heat-radiating member 34 that is the other heat-radiating members in pair is joined to a top surface electrode 14a of the second semiconductor element 14 via a second spacer block 44 and solder layers 54, 55. The second spacer block 44 is formed by a metallic material (specifically copper) having a higher thermal conductivity than that of the material configuring the sealing body 20. The second heat-radiating member 38 that is the other of the heat-radiating members in pair is joined to a bottom surface electrode 14b of the second semiconductor element 14 via a solder layer 56. Through these components, the second semiconductor element 14 is thermally connected to both the first heat-radiating member 34 exposed at the front surface 21 of the sealing body 20 and the second heat-radiating member 38 exposed at the back surface 22 of the sealing body 20. Heat generated in the second semiconductor element 14 is transferred to the first heat-radiating member 34 and the second heat-radiating member 38, and is then radiated to the outside of the sealing body 20.

In the semiconductor device 10 of the present embodiment, the two first heat-radiating members 32, 34, the two heat-radiating members 36, 38, and the first spacer block 42 and the second spacer block 44 not only serve as members for heat radiation, but also configure an electric conductive path electrically connected to the first semiconductor element 12 and the second semiconductor element 14. A joint 33 of the first heat-radiating member 32 connected to the top surface electrode 12a of the first semiconductor element 12 and a joint 39 of the second heat-radiating member 38 connected to the bottom surface electrode 14b of the second semiconductor element 14 are connected to each other via a solder layer 57 so as to be electrically connected to each other. Through this, the first semiconductor element 12 and the second semiconductor element 14 are electrically connected in series to each other.

Figure 2:
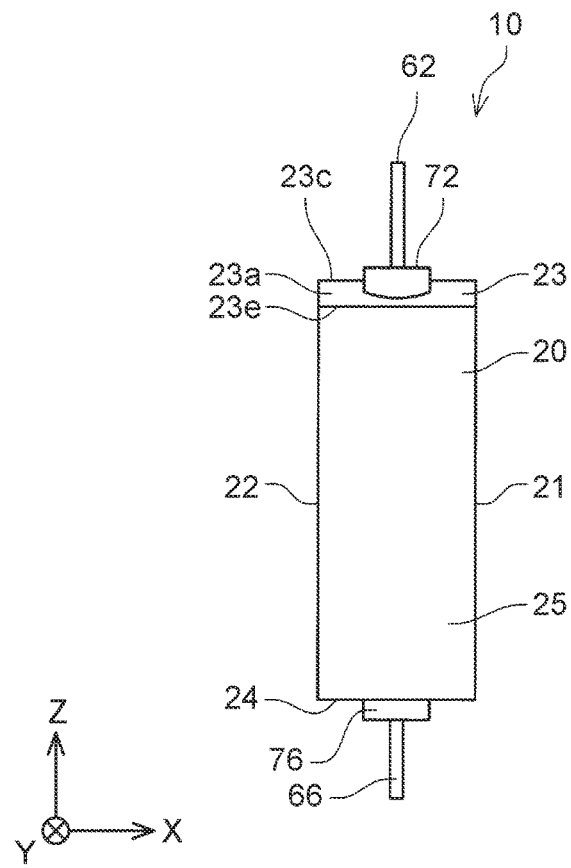
FIG. 2 is a right side view of the semiconductor device of the embodiment.

As shown in FIG. 1, FIG. 2, and FIG. 4, the semiconductor device 10 further includes plural first signal terminals 62 and plural second signal terminals 64. Each of the first signal terminals 62 and the second signal terminals 64 projects from the top surface 23 of the sealing body 20 in the Z-axis positive direction (first direction) in the drawing. As shown in FIG. 4, the plural first signal terminals 62 are electrically connected via bonding wires 63 to plural signal pads 12c provided to the first semiconductor element 12. As an example, the plural first signal terminals 62 may include a signal terminal for gate signals, a signal terminal for temperature sensing, and a signal terminal for current sensing. Similarly, although not shown in the drawings, the plural second signal terminals 64 are electrically connected to plural signal pads provided to the second semiconductor element 14. The plural second signal terminals 64 may also include, for example, a signal terminal for gate signals, a signal terminal for temperature sensing, and a signal terminal for current sensing. The semiconductor device 10 may be configured to include at least one first signal terminal 62 and at least one second signal terminal 64.

The semiconductor device 10 further includes a positive electrode terminal 66, a negative electrode terminal 67, and an output terminal 68. The positive electrode terminal 66, the negative electrode terminal 67, and the output terminal 68 project from the bottom surface 24 of the sealing body 20 in the Z-axis negative direction in the drawing. The positive electrode terminal 66 is electrically connected to the second heat-radiating member 36 joined to the bottom surface electrode 12b of the first semiconductor element 12. The negative electrode terminal 67 is electrically connected to the first heat-radiating member 34 joined to the top surface electrode 14a of the second semiconductor element 14 via the second spacer block 44. The output terminal 68 is electrically connected to the second heat-radiating member 38 joined to the bottom surface electrode 14b of the second semiconductor element 14. Through this, the positive electrode terminal 66 is electrically connected to the bottom surface electrode 12b of the first semiconductor element 12, the negative electrode terminal 67 is electrically connected to the top surface electrode 14a of the second semiconductor element 14, and the output terminal 68 is electrically connected to the top surface electrode 12a of the first semiconductor element 12 and the bottom surface electrode 14b of the second semiconductor element 14 (see FIG. 5).

Configurations of the top surface 23 and the bottom surface 24 of the sealing body 20 will be described in details, hereinafter. As shown in FIG. 1, the top surface 23 of the sealing body 20 includes a first inclined surface 23a, a second inclined surface 23b, and a boundary line 23c located between the first inclined surface 23a and the second inclined surface 23b. The first inclined surface 23a and the second inclined surface 23b are in contact with each other at the boundary line 23c. The boundary line 23c intersects a minimum creepage path L between the first signal terminals 62 and the second signal terminals 64, and includes one point on the minimum creepage path L. The minimum creepage path L referred to herein denotes a path defined by connecting the first signal terminals 62 and the second signal terminals 64 along the top surface 23 of the sealing body 20 in a shortest distance. Each of the first inclined surface 23a and the second inclined surface 23b is inclined from the boundary line 23c toward a circumferential edge 23e of the top surface 23 in the Z-axis negative direction. Hence, if the Z-axis positive direction (i.e., a direction in which the first signal terminals 62 and the second signal terminals 64 project from the sealing body 20) is directed to a vertically upward direction, each of the first inclined surface 23a and the second inclined surface 23b is inclined from the boundary line 23c toward the circumferential edge 23e of the top surface 23 in the Z-axis negative direction.

The first inclined surface 23a is inclined from the boundary line 23c toward the right surface 25, and the second inclined surface 23b is inclined from the boundary line 23c toward the left surface 26. The first inclined surface 23a is continued from the boundary line 23c to the right surface 25, and the second inclined surface 23b is continued from the boundary line 23c to the left surface 26. As another embodiment, the first inclined surface 23a and the second inclined surface 23b may be apart from each other. In this case, instead of the boundary line 23c, a boundary range (plane segment) having a certain area is present between the first inclined surface 23a and the second inclined surface 23b. In some embodiments, the boundary range may intersect the minimum creepage path L, and this boundary range may include at least part of the minimum creepage path L.

The top surface 23 of the sealing body 20 further includes a first projecting portion 72 and a second projecting portion 74. The first projecting portion 72 is provided around the plural first signal terminals 62, and projects in the Z-axis positive direction along the plural first signal terminals 62. The second projecting portion 74 is provided around the plural second signal terminals 64, and projects in the Z-axis positive direction along the plural second signal terminals 64. Accordingly, if the Z-axis positive direction is directed to the vertically upward direction, each of the first projecting portion 72 and the second projecting portion 74 projects vertically upward from the top surface 23 of the sealing body 20. The plural first signal terminals 62 project vertically upward from the first projecting portion 72, and the plural second signal terminals 64 project vertically upward from the second projecting portion 74.

The bottom surface 24 of the sealing body 20 includes a third inclined surface 24a, a fourth inclined surface 24b, and a boundary line 24c located between the third inclined surface 24a and the fourth inclined surface 24b. The third inclined surface 24a and the fourth inclined surface 24b are in contact with each other at the boundary line 24c. Each of the third inclined surface 24a and the fourth inclined surface 24b is inclined in the Z-axis negative direction from the boundary line 24c toward a circumferential edge 24e of the bottom surface 24. The third inclined surface 24a is inclined from the boundary line 24c toward the right surface 25, and the fourth inclined surface 24b is inclined from the boundary line 24c toward the left surface 26. The third inclined surface 24a is continued from the boundary line 24c to the right surface 25, and the fourth inclined surface 24b is continued from the boundary line 24c to the left surface 26.

The bottom surface 24 of the sealing body 20 further includes a third projecting portion 76, a fourth projecting portion 77, and a fifth projecting portion 78. The third projecting portion 76 is provided around the positive electrode terminal 66, and projects in the Z-axis negative direction along the positive electrode terminal 66. The fourth projecting portion 77 is provided around the negative electrode terminal 67, and projects in the Z-axis negative direction along the negative electrode terminal 67. The fifth projecting portion 78 is provided around the output terminal 68, and projects in the Z-axis negative direction along the output terminal 68.

Figure 6:
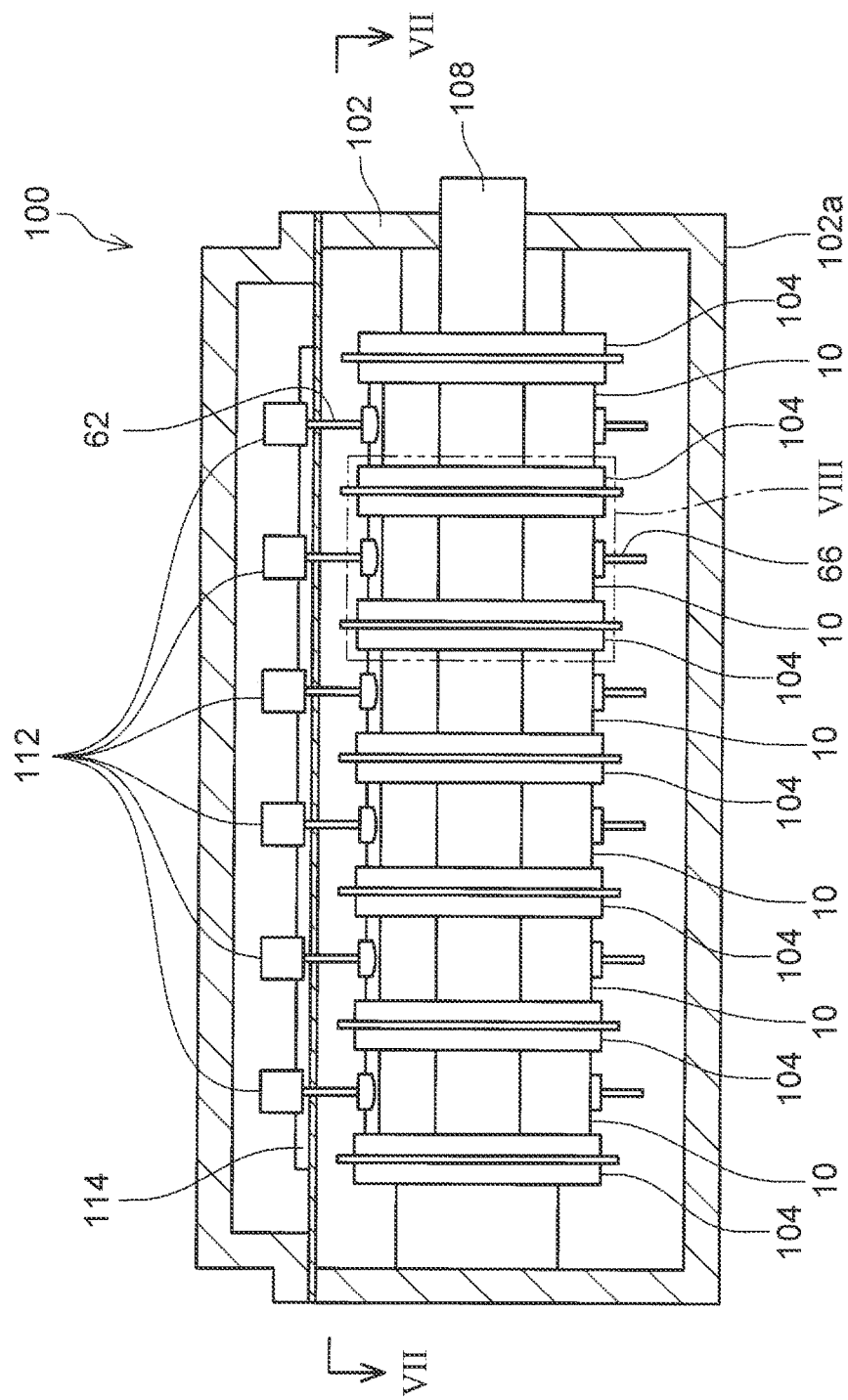
FIG. 6 is a drawing schematically showing a configuration of an electric power converting apparatus.
Figure 7:
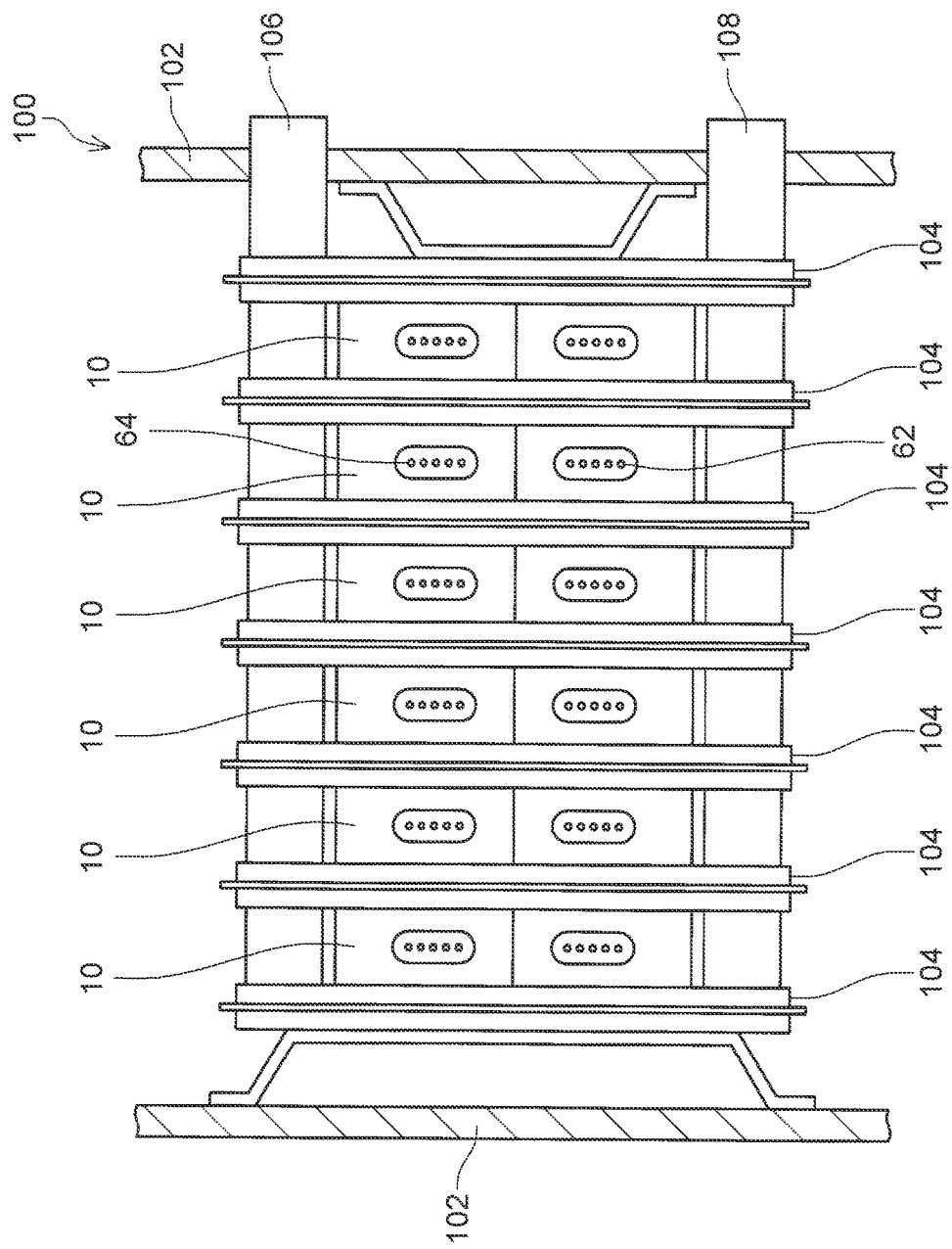
FIG. 7 is a sectional view taken along line VII-VII in FIG. 1.

With reference to FIG. 6, FIG. 7, and FIG. 8, the electric power converting apparatus 100 in which the aforementioned semiconductor devices 10 are employed will be described. The electric power converting apparatus 100 is designed for an electric vehicle (including an electric vehicle, a hybrid vehicle, and a fuel cell vehicle) whose wheels are driven by electric power. Hence, the electric power converting apparatus 100 is usually installed in an automobile. The electric power converting apparatus 100 includes a case 102, the plural semiconductor devices 10, plural cooling units 104, coolant pipe passages 106, 108 circulating a coolant (e.g., a cooling water) to the plural cooling units 104. The plural semiconductor devices 10 and the plural cooling units 104 are alternately arranged, and each semiconductor device 10 is located between each two adjacent cooling units 104. The case 102 houses the plural semiconductor devices 10 and the plural cooling units 104 thereinside. The configuration of the case 102 is not limited to a particular one. As an example, the case 102 in the present embodiment is configured by using a metallic material. The electric power converting apparatus 100 includes a control board 114 controlling operations of the plural semiconductor devices 10. The control board 114 includes plural connectors 112, and the plural first signal terminals 62 or the plural second signal terminals 64 of each semiconductor device 10 are connected to each connector 112. In this manner, the control board 114 is connected to the plural semiconductor devices 10 in a manner as to be able to transmit and receive gate signals and other signals relative to the plural semiconductor devices 10. The control board 114 is housed in the case 102.

As shown in FIG. 8, the semiconductor device 10 is arranged such that the front surface 21 of the sealing body 20 faces one of the two adjacent cooling units 104, and the back surface 22 of the sealing body 20 faces the other of the two adjacent cooling units 104. As aforementioned, the two first heat-radiating members 32, 34 are exposed at the front surface 21 of the sealing body 20, and the second heat-radiating members 36, 38 are exposed at the back surface 22 of the sealing body 20. Heat generated in each semiconductor device 10 is transferred to the cooling units 104 via the plural heat-radiating members 32, 34, 36, 38, and is collected by the coolant flowing through the cooling units 104. Through this, overheat of each semiconductor device 10 is prevented. A gap between the front surface 21 of the sealing body 20 and the corresponding cooling unit 104 facing this front surface 21 is filled with grease 110. Similarly, a gap between the back surface 22 of the sealing body 20 and the corresponding cooling unit 104 facing this back surface 22 is also filled with grease 110. In this manner, the gaps between the sealing body 20 and the cooling units 104 are filled with the grease 110 so as to eliminate fine voids therebetween, thereby enhancing thermal conductivity therebetween. The grease 110 contains particles having a high thermal conductivity, and such grease is also referred to as a thermal grease.

A posture of the electric power converting apparatus 100 in use is defined, and the electric power converting apparatus 100 is installed in an electric vehicle with the bottom surface 102a of the case 102 located vertically downward. In this case, the control board 114 is located vertically upward of the plural semiconductor devices 10, and each of the semiconductor devices 10 is arranged such that the first signal terminals 62 and the second signal terminals 64 project in the vertically upward direction. The electric power converting apparatus 100 installed in the electric vehicle converts direct current (DC) power supplied from a battery into alternating current (AC) power, and supplies this to a motor. Conversely, the electric power converting apparatus 100 converts AC power generated by the motor into DC power, and supplies this to the battery. At this time, since a great current flows through the respective semiconductor devices 10, the components of each semiconductor device 10 expand with heat, so that the outer shape of the sealing body 20 becomes larger.

Figure 9:
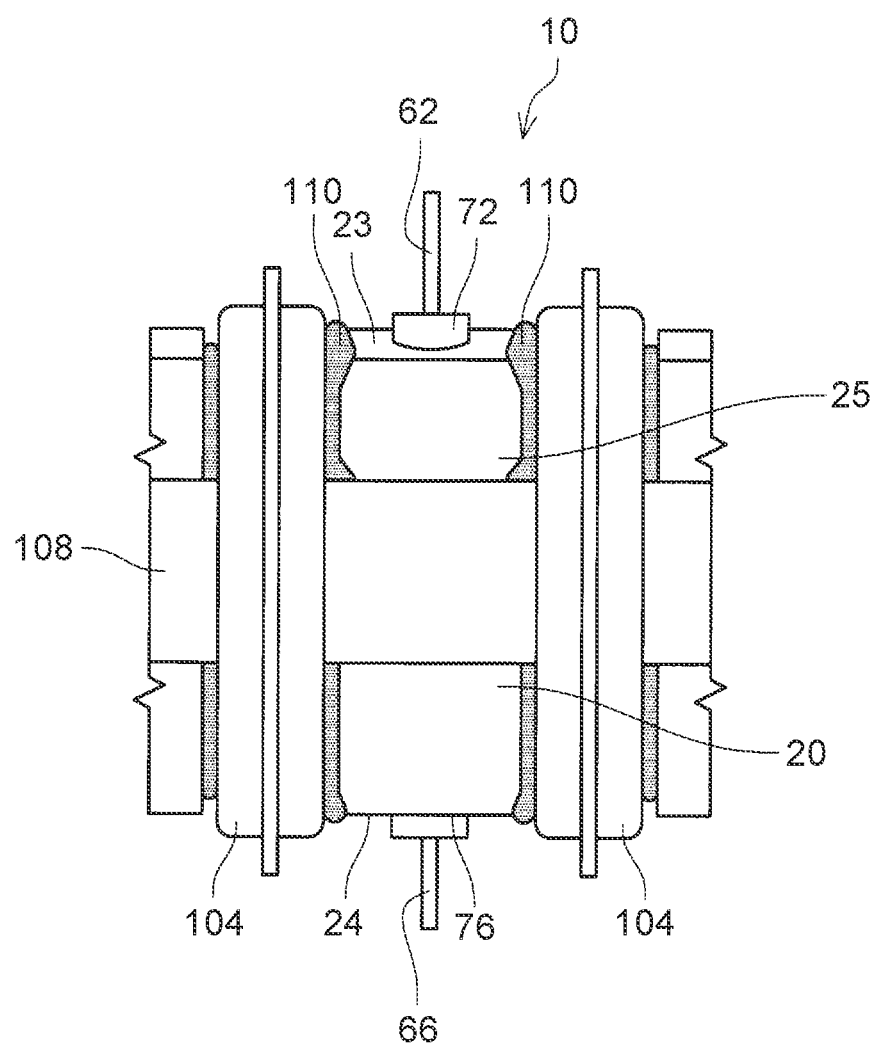
FIG. 9 is a side view of each semiconductor device that schematically shows grease squeezed out between a sealing body and cooling units.
Figure 10:
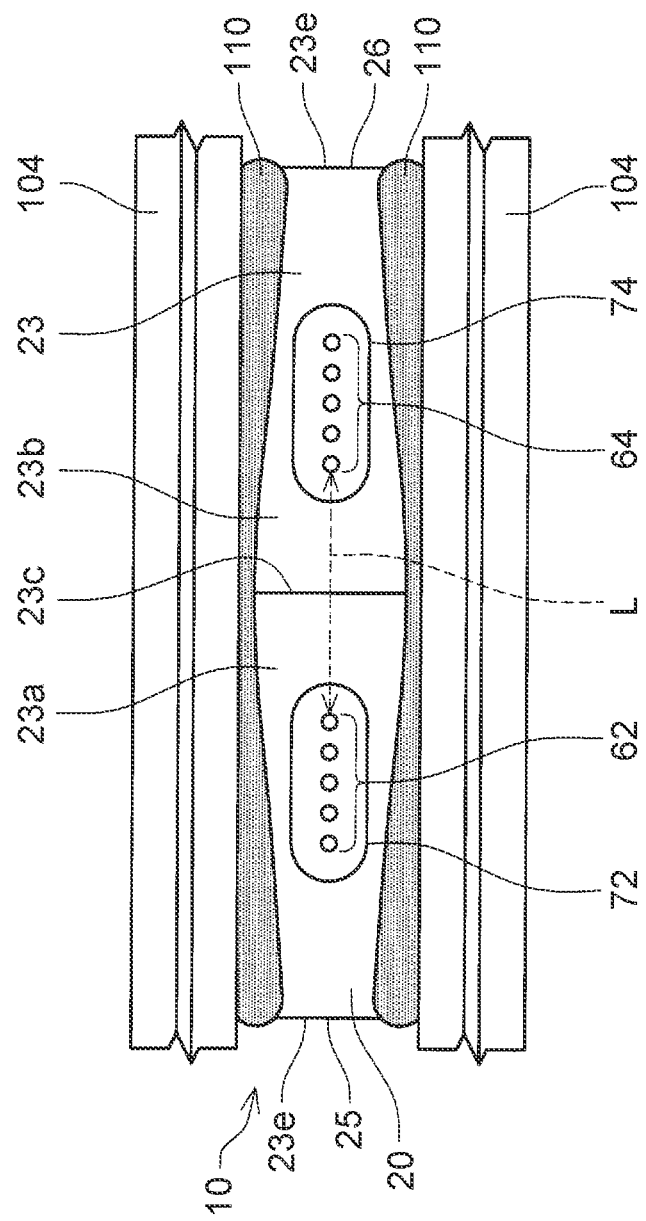
FIG. 10 is a plan view of the semiconductor device that schematically shows the grease squeezed out between the sealing body and the cooling units.
Figure 11:
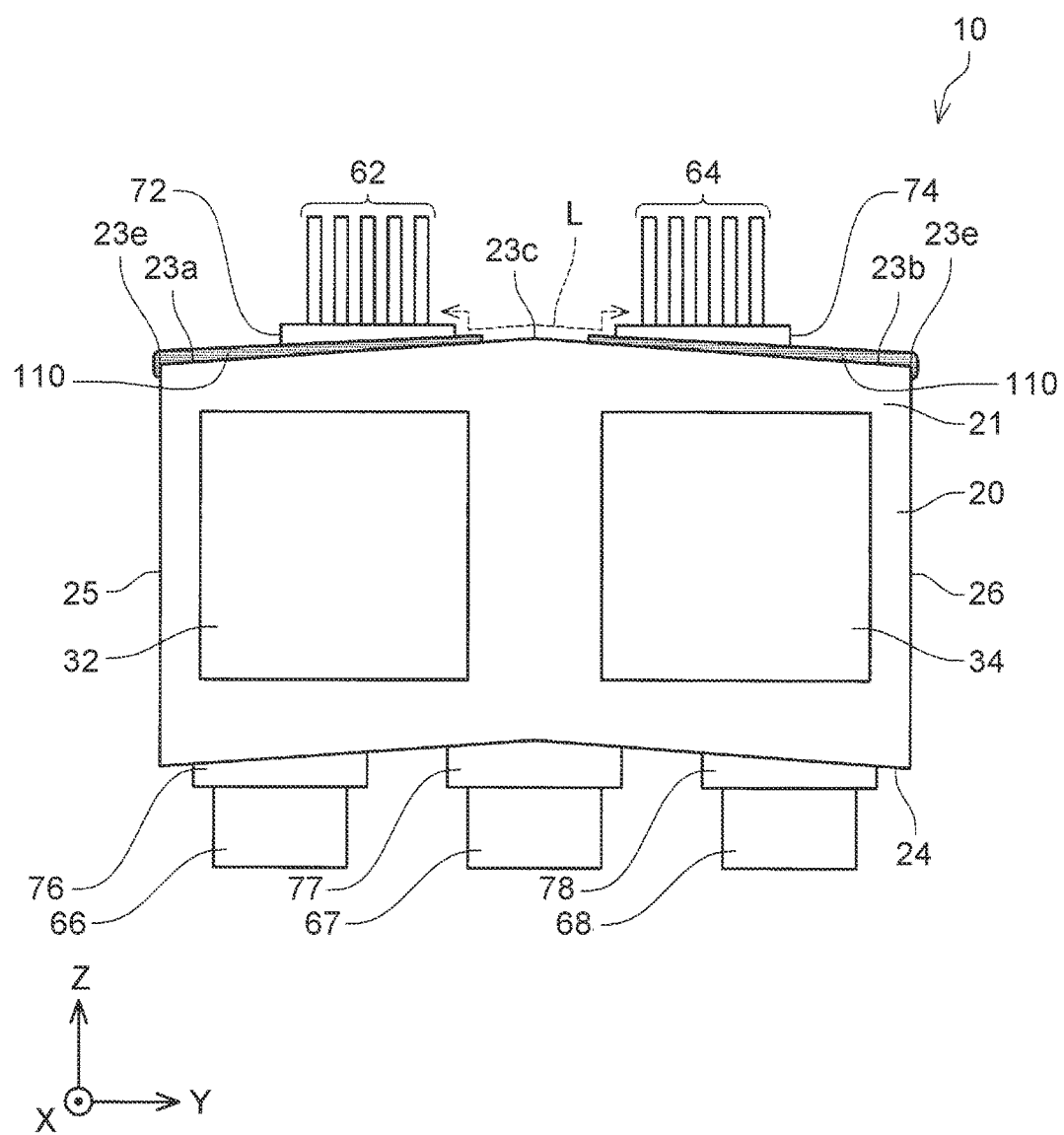
FIG. 11 is a front view of the semiconductor device that schematically shows the grease squeezed out between the sealing body and the cooling units.

As shown in FIG. 9, FIG. 10, and FIG. 11, if the outer shape of the sealing body 20 becomes larger, the grease 110 might be squeezed out between the sealing body 20 and the cooling units 104, and flow to the top surface 23 and the bottom surface 24 of the sealing body 20. However, the grease 110 has no electric conductivity; therefore, even if the grease 110 having flowed to the top surface 23 arrives at the minimum creepage path L, it is avoided that the electric insulation between the first signal terminals 62 and the second signal terminals 64 immediately becomes deteriorated. Nevertheless, electrically-conductive foreign substances, such as metallic powders generated from the case 102, the control board 114, and others probably adhere to the grease 110 having flowed to the top surface 23. If the grease 110 to which a lot of electrically-conductive foreign substances adhere arrives at the minimum creepage path L, the electric insulation between the first signal terminals 62 and the second signal terminals 64 is likely to be deteriorated.

With respect to the above configuration, in each semiconductor device 10 of the present embodiment, the top surface 23 of the sealing body 20 is configured to have the first inclined surface 23a and the second inclined surface 23b. As aforementioned, the first inclined surface 23a is inclined in the vertically downward direction from the boundary line 23c intersecting the minimum creepage path L toward the right surface 25. Similarly, the second inclined surface 23b is inclined in the vertically downward direction from the boundary line 23c toward the left surface 26. Through this, the grease 110 having flowed to the top surface 23 of the sealing body 20 flows on the first inclined surface 23a and the second inclined surface 23b toward the right surface 25 or toward the left surface 26. This means that the grease 110 flows in a manner as to be apart from the minimum creepage path L. Through this, the grease 110 having flowed to the top surface of the sealing body 20 is prevented from arriving at the minimum creepage path L, thereby avoiding deterioration of the electric insulation between the first signal terminals 62 and the second signal terminals 64. The right surface 25 and the left surface 26 of the sealing body 20 are out of contact with the cooling units 104, and thus a space is present along the right surface 25 and the left surface 26. Accordingly, the grease 110 having flowed along the first inclined surface 23a or the second inclined surface 23b flows over the circumferential edge 23e of the top surface 23, and is then discharged to the right surface 25 or to the left surface 26.

Each inclination angle (an angle relative to a horizontal plane) of the first inclined surface 23a and the second inclined surface 23b is not limited to a particular angle, and may be appropriately designed in consideration of a viscosity of the grease 110, affinity between the grease 110 and the sealing body 20, a maximum dimension allowed for the sealing body 20, and others. Since the electric power converting apparatus 100 is installed in an electric vehicle, flow of the grease 110 is promoted by vibrations generated by the electric vehicle even if the viscosity of the grease 110 is relatively high. Based on this, each inclination angle of the first inclined surface 23a and the second inclined surface 23b can be designed to be relatively small.

In addition, the top surface 23 of the sealing body 20 is configured to have the first projecting portion 72 and the second projecting portion 74. The first projecting portion 72 projects vertically upward along the plural first signal terminals 62, and thus it is possible to prohibit or prevent the grease 110 having flowed to the top surface 23 of the sealing body 20 from arriving at the first signal terminals 62. Similarly, the second projecting portion 74 projects vertically upward along the plural second signal terminals 64, and thus it is possible to prohibit or prevent the grease 110 having flowed to the top surface 23 of the sealing body 20 from arriving at the second signal terminals 64. Accordingly, it is possible to further avoid deterioration of the electric insulation between the first signal terminals 62 and the second signal terminals 64.

The grease 110 having flowed to the bottom surface 24 of the sealing body 20 flows along the third inclined surface 24a and the fourth inclined surface 24b, thereby preventing much of the grease 110 from stagnating at the bottom surface 24. Arrival of the grease 110 at the positive electrode terminal 66, the negative electrode terminal 67, and the output terminal 68 is also suppressed by the third projecting portion 76, the fourth projecting portion 77, and the fifth projecting portion 78 included in the bottom surface 24.

Figure 12:
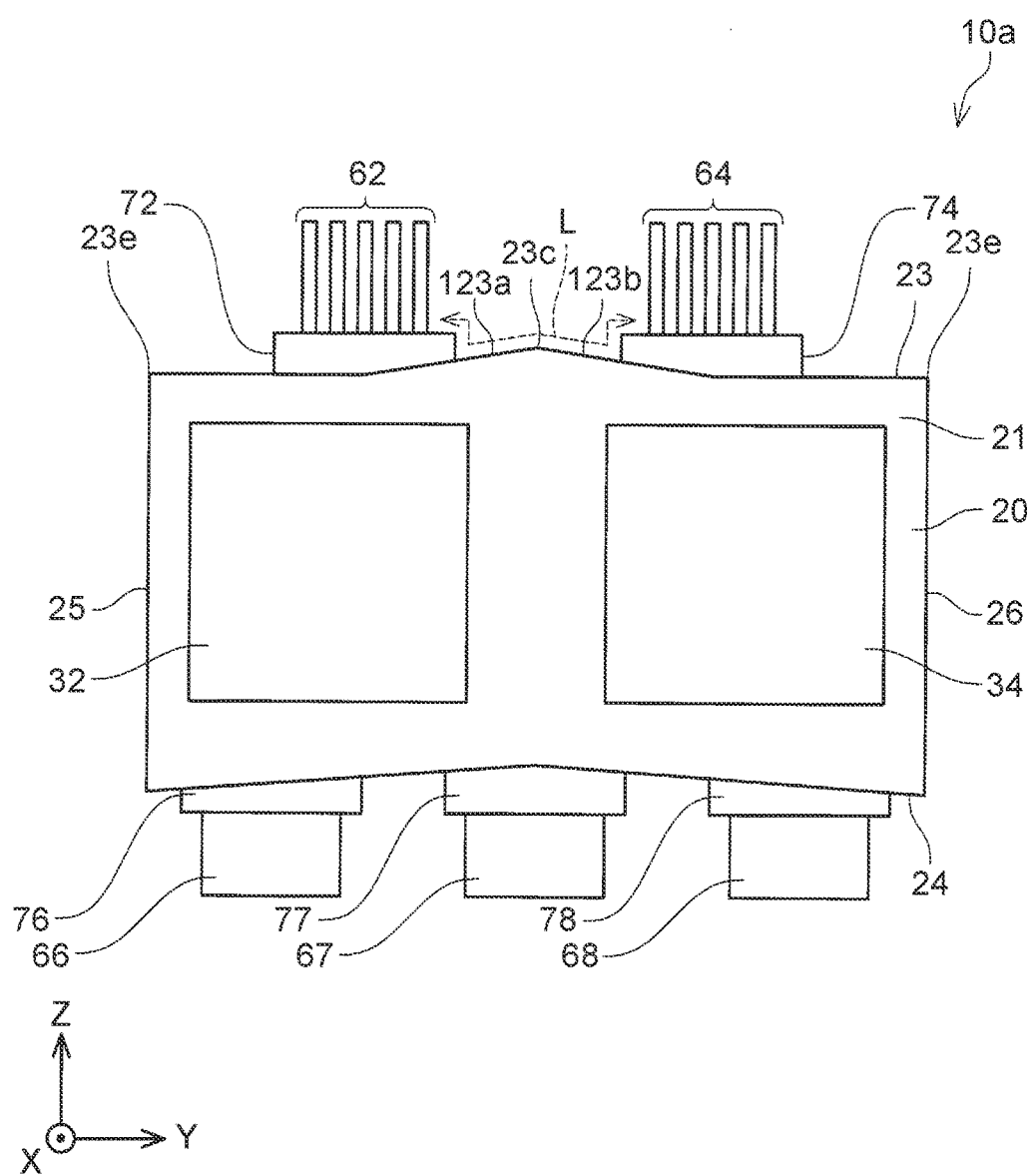
FIG. 12 is a front view showing a semiconductor device of a variation.
Figure 13:
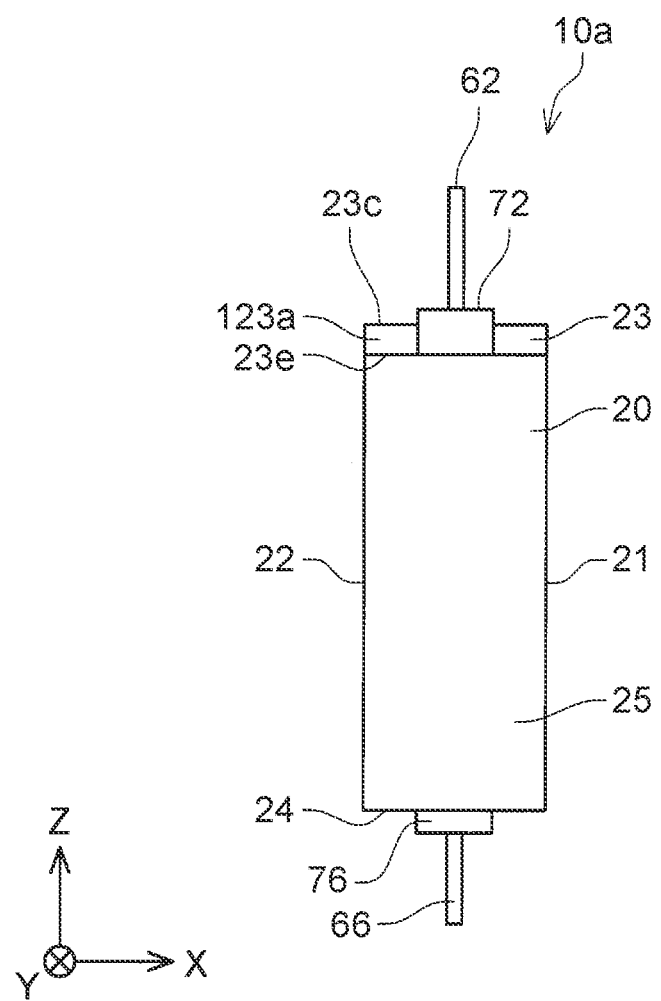
FIG. 13 is a right side view showing the semiconductor device of the variation.

The configurations of the first inclined surface 23a and the second inclined surface 23b included in the top surface 23 of the sealing body 20 may be variously changed. For example, in a semiconductor device 10a that is another variation as shown in FIG. 12 and FIG. 13, only a part of the top surface 23, in particular, only a part thereof within a range close to the minimum creepage path L between the first signal terminals 62 and the second signal terminals 64 is configured to have a first inclined surface 123a and a second inclined surface 123b. Also in the semiconductor device 10a, the first inclined surface 123a and the second inclined surface 123b are in contact with each other at the boundary line 23c, and the boundary line 23c intersects the minimum creepage path L between the first signal terminals 62 and the second signal terminals 64. Each of the first inclined surface 123a and the second inclined surface 123b is inclined from the boundary line 23c toward circumferential edge 23e of the top surface 23 in the Z-axis negative direction. Hence, if the Z-axis positive direction (i.e., in the direction in which the first signal terminals 62 and the second signal terminals 64 project from the sealing body 20) is directed to the vertically upward direction, each of the first inclined surface 123a and the second inclined surface 123b is inclined from the boundary line 23c toward the circumferential edge 23e of the top surface 23 in the Z-axis negative direction. The first inclined surface 123a is inclined from the boundary line 23c toward the right surface 25, and the second inclined surface 123b is inclined from the boundary line 23c toward the left surface 26.

In some embodiments, the semiconductor device 10a may also be employed in the aforementioned electric power converting apparatus 100. If the grease 110 is squeezed out between the sealing body 20 and the cooling units 104 to flow to the top surface 23 of the sealing body 20, this grease 110 flows in a manner as to be apart from the minimum creepage path L by the first inclined surface 123a and the second inclined surface 123b. Accordingly, it is possible to prevent the grease 110 having flowed to the top surface of the sealing body 20 from arriving at the minimum creepage path L, and avoid deterioration of the electric insulation between the first signal terminals 62 and the second signal terminals 64. Also in this variation, the first inclined surface 123a and the second inclined surface 123b may be apart from each other. In this case, instead of the boundary line 23c, a boundary range (plane segment) having a certain area is present between the first inclined surface 123a and the second inclined surface 123b, and this boundary range intersects the minimum creepage path L.

Figure 14:
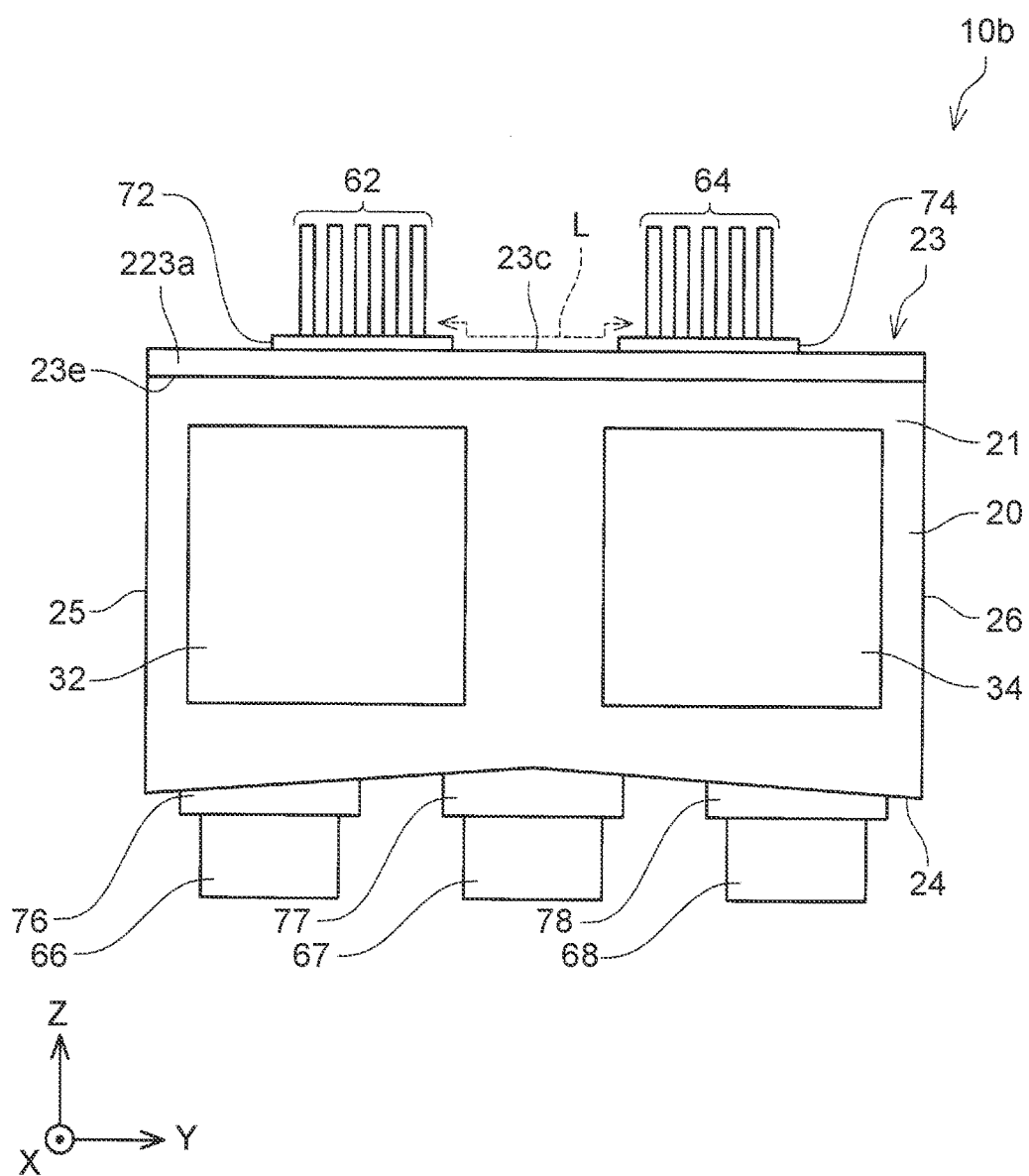
FIG. 14 is a front view showing a semiconductor device of another variation.
Figure 15:
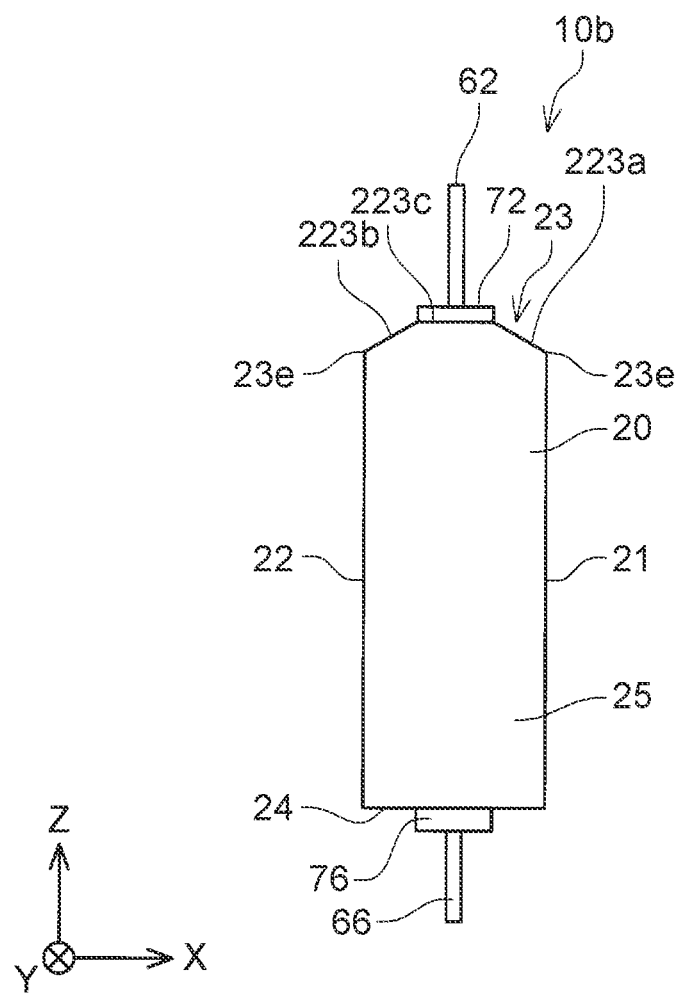
FIG. 15 is a right side view showing the semiconductor device of another variation.

In a semiconductor device 10b that is another variation as shown in FIG. 14 and FIG. 15, compared with the aforementioned semiconductor devices 10 and 10a, inclination directions of a first inclined surface 223a and a second inclined surface 223b are changed. In this semiconductor device 10b, the sealing body 20 includes the first inclined surface 223a, the second inclined surface 223b, and a boundary range 223c located between the first inclined surface 223a and the second inclined surface 223b. The boundary range 223c extends parallel with the minimum creepage path L between the first signal terminals 62 and the second signal terminals 64, and includes substantially the entire minimum creepage path L. The first inclined surface 223a is located on the front surface 21 side from the boundary range 223c, and the second inclined surface 223b is located on the back surface 22 side from the boundary range 223c. Each of the first inclined surface 223a and the second inclined surface 223b is inclined from the boundary range 223c toward a circumferential edge 23e of the top surface 23 in the Z-axis negative direction. Specifically, the first inclined surface 223a is inclined from the boundary range 223c toward the front surface 21, and is continued to the front surface 21. The second inclined surface 223b is inclined from the boundary range 223c toward the back surface 22, and is continued to the back surface 22.

In some embodiments, the semiconductor device 10b may also be employed in the aforementioned electric power converting apparatus 100. If the grease 110 is squeezed out between the sealing body 20 and the cooling units 104 to flow to the top surface 23 of the sealing body 20, this grease 110 flows in a manner as to be apart from the minimum creepage path L by the first inclined surface 223a and the second inclined surface 223b. Accordingly, it is possible to prevent the grease 110 having flowed to the top surface of the sealing body 20 from arriving at the minimum creepage path L, thereby avoiding deterioration of the electric insulation between the first signal terminals 62 and the second signal terminals 64. Also in this variation, the first inclined surface 223a and the second inclined surface 223b may be adjacent to each other. In this case, instead of the boundary range 223c, a boundary line is present between the first inclined surface 223a and the second inclined surface 223b, and this boundary line extends on the minimum creepage path L.

As described above, several specific examples have been explained, but these examples are merely exemplified, and it is not intended to limit the scope of the claims. Techniques described in the claims may include various changes and modifications of the above examples. Technical features that can be grasped from the disclosed contents of the present specification will be listed as below. The technical features described below are respective independent technical features, which exert technical usefulness independently or through various combinations thereof.

Each semiconductor device 10, 10a, 10b disclosed in the present specification includes: the first semiconductor element 12; the second semiconductor element 14 electrically connected in series to the first semiconductor element 12; the sealing body 20 sealing the first semiconductor element 12 and the second semiconductor element 14; first heat-radiating members 32, 34 exposed at the front surface 21 of the sealing body 20, and configured by a material having a higher thermal conductivity than that of a material configuring the sealing body 20; second heat-radiating members 36, 38 exposed at the back surface 22 located on an opposite side to the front surface 21 of the sealing body 20, and configured by a material having a higher thermal conductivity than that of the material configuring the sealing body 20; at least one first signal terminal 62 electrically connected to the first semiconductor element 12, and projecting from the top surface 23 adjacent to the front surface 21 and to the back surface 22 of the sealing body 20 along the first direction Z; and at least one second signal terminal 64 electrically connected to the second semiconductor element 14, and projecting from the top surface 23 of the sealing body 20 along the first direction Z.

The top surface 23 of the sealing body 20 includes the first inclined surface 23a, 123a, 223a; the second inclined surface 23b, 123b, 223b; and the boundary line 23c or the boundary range 223c located between the first inclined surface 23a, 123a, 223a and the second inclined surface 23b, 123b, 223b. The boundary line 23c or the boundary range 223c includes at least part of the minimum creepage path L between the first signal terminals 62 and the second signal terminals 64. If the first direction Z is directed to the vertically upward direction, each of the first inclined surface 23a, 123a, 223a and the second inclined surface 23b, 123b, 223b is inclined vertically downward from the boundary line 23c or the boundary range 223c toward the circumferential edge 23e of the top surface 23. According to this configuration, if the semiconductor device 10, 10a, 10b is disposed between the two cooling units via the grease 110, it is possible to prevent or reduce deterioration of the electric insulation between the signal terminals 62 and 64 by the grease 110.

In each aforementioned semiconductor device 10, 10a, the sealing body 20 may further include: the right surface 25 that is adjacent to the front surface 21, the back surface 22, and the top surface 23; and the left surface 26 that is adjacent to the front surface 21, the back surface 22, and the top surface 23, and also is located on an opposite side to the right surface 25. In some embodiments, the first inclined surface 23a, 123a may be inclined from the boundary line 23c or the boundary range toward the right surface 25, and the second inclined surface 23b, 123b may be inclined from the boundary line 23c or the boundary range toward the left surface 26. According to this configuration, it is possible to bring the grease 110 having flowed to the top surface 23 of the sealing body 20 to flow toward the right surface 25 or the left surface 26 that does not face the cooling unit 104, that is, toward a direction where no grease 110 is originally present.

In addition to the above, the first inclined surface 23a, 123a may be continued from the boundary line 23c or the boundary range to the right surface 25, and the second inclined surface 23b, 123b may be continued from the boundary line 23c or the boundary range to the left surface 26. According to this configuration, it is possible to bring the grease 110 having flowed to the top surface 23 of the sealing body 20 to flow to the right surface 25 or to the left surface 26 so as to be discharged from the top surface 23 of the sealing body 20.

In each aforementioned semiconductor device 10, 10a, 10b, the top surface 23 of the sealing body 20 may further include the first projecting portion 72 projecting along the at least one first signal terminal 62 and the second projecting portion 74 projecting along the at least one second signal terminal 64. According to this configuration, it is possible to prohibit or suppress arrival of the grease 110 having flowed to the top surface 23 of the sealing body 20 at the first signal terminal 62 or the second signal terminal 64.

What is claimed is:
1. A semiconductor device comprising:
a first semiconductor element;
a second semiconductor element electrically connected in series to the first semiconductor element:
a sealing body sealing the first semiconductor element and the second semiconductor element;
first heat-radiating members exposed at a front surface of the sealing body, the first heat-radiating members configured by a material having a higher thermal conductivity than that of a material configuring the sealing body;
second heat-radiating members exposed at a back surface of the sealing body located on an opposite side to the front surface of the sealing body, the second heat-radiating members configured by a material having a higher thermal conductivity than that of the material configuring the sealing body;
at least one first signal terminal electrically connected to the first semiconductor element, the first signal terminal projecting from a top surface adjacent to the front surface and the back surface of the sealing body along a first direction; and
at least one second signal terminal electrically connected to the second semiconductor element, the second signal terminal projecting from the top surface of the sealing body along the first direction,
wherein
the top surface of the sealing body includes: a first inclined surface; a second inclined surface; and a boundary line or a boundary range located between the first inclined surface and the second inclined surface, wherein the first inclined surface has an inclination angle and the second inclined surface has an inclination angle,
the boundary line or the boundary range includes at least part of a minimum creepage path between the first signal terminal and the second signal terminal, and
if the first direction is directed to a vertically upward direction, each of the first inclined surface and the second inclined surface is inclined in a vertically downward direction from the boundary line or the boundary range toward a circumferential edge of the top surface.
2. The semiconductor device according to claim 1, wherein
the sealing body further includes: a right surface adjacent to the front surface, the back surface, and the top surface; and a left surface adjacent to the front surface, the back surface, and the top surface, the left surface located on an opposite side to the right surface,
the first inclined surface is inclined from the boundary line or the boundary range toward the right surface, and
the second inclined surface is inclined from the boundary line or the boundary range toward the left surface.
3. The semiconductor device according to claim 2, wherein
the first inclined surface is continued from the boundary line or the boundary range to the right surface, and the second inclined surface is continued from the boundary line or the boundary range to the left surface.
4. The semiconductor device according to claim 1, wherein
the top surface of the sealing body further includes: a first projecting portion projecting along the at least one first signal terminal; and a second projecting portion projecting along the at least one second signal terminal.
5. The semiconductor device according to claim 1, wherein
the sealing body further includes: a right surface adjacent to the front surface, the back surface, and the top surface; and a left surface adjacent to the front surface, the back surface, and the top surface, the left surface located on an opposite side to the right surface,
the first inclined surface is inclined from the boundary line or the boundary range toward the front surface, and
the second inclined surface is inclined from the boundary line or the boundary range toward the back surface.
6. A semiconductor device comprising:
a first semiconductor element;
a second semiconductor element electrically connected in series to the first semiconductor element:
a sealing body sealing the first semiconductor element and the second semiconductor element;

heat-radiating members exposed at at least one of a front surface of the sealing body and a back surface of the sealing body located on an opposite side to the front surface, the heat-radiating members configured by a material having a higher thermal conductivity than that of a material configuring the sealing body;

at least one first signal terminal electrically connected to the first semiconductor element, the first signal terminal projecting from a top surface adjacent to the front surface and the back surface of the sealing body along a first direction; and at least one second signal terminal electrically connected to the second semiconductor element, the second signal terminal projecting from the top surface of the sealing body along the first direction, wherein the top surface of the sealing body includes a first inclined surface; a second inclined surface; and a boundary line or a boundary range located between the first inclined surface and the second inclined surface, wherein the first inclined surface has an inclination angle and the second inclined surface has an inclination angle, the boundary line or the boundary range includes at least part of a minimum creepage path between the first signal terminal and the second signal terminal, and if the first direction is directed to a vertically upward direction, each of the first inclined surface and the second inclined surface is inclined in a vertically downward direction from the boundary line or the boundary range toward a circumferential edge of the top surface.

7. A semiconductor device comprising:

a first semiconductor element;

a second semiconductor element electrically connected in series to the first semiconductor element:

a sealing body sealing the first semiconductor element and the second semiconductor element;

first heat-radiating members exposed at a front surface of the sealing body, the first heat-radiating members configured by a material having a higher thermal conductivity than that of a material configuring the sealing body;

second heat-radiating members exposed at a back surface of the sealing body located on an opposite side to the front surface of the sealing body, the second heat-radiating members configured by a material having a higher thermal conductivity than that of the material configuring the sealing body;

at least one first signal terminal electrically connected to the first semiconductor element, the first signal terminal projecting from a top surface adjacent to the front surface and the back surface of the sealing body along a first direction; and at least one second signal terminal electrically connected to the second semiconductor element, the second signal terminal projecting from the top surface of the sealing body along the first direction, wherein the top surface of the sealing body includes: a first inclined surface; a second inclined surface; and a boundary line or a boundary range located between the first inclined surface and the second inclined surface, the boundary line or the boundary range includes at least part of a minimum creepage path between the first signal terminal and the second signal terminal, if the first direction is directed to a vertically upward direction, each of the first inclined surface and the second inclined surface is inclined in a vertically downward direction from the boundary line or the boundary range toward a circumferential edge of the top surface, and at least one of the first inclined surface and the second inclined surface is formed at least on the top surface where the first signal terminal or the second signal terminal is placed.

8. The semiconductor device according to claim 7, wherein the sealing body further includes: a right surface adjacent to the front surface, the back surface, and the top surface; and a left surface adjacent to the front surface, the back surface, and the top surface, the left surface located on an opposite side to the right surface, the first inclined surface is inclined from the boundary line or the boundary range toward the right surface, and the second inclined surface is inclined from the boundary line or the boundary range toward the left surface.

9. The semiconductor device according to claim 8, wherein the first inclined surface is continued from the boundary line or the boundary range to the right surface, and the second inclined surface is continued from the boundary line or the boundary range to the left surface.

10. The semiconductor device according to claim 7, wherein the top surface of the sealing body further includes: a first projecting portion projecting along the at least one first signal terminal; and a second projecting portion projecting along the at least one second signal terminal.

11. The semiconductor device according to claim 7, wherein the sealing body further includes: a right surface adjacent to the front surface, the back surface, and the top surface; and a left surface adjacent to the front surface, the back surface, and the top surface, the left surface located on an opposite side to the right surface, the first inclined surface is inclined from the boundary line or the boundary range toward the front surface, and the second inclined surface is inclined from the boundary line or the boundary range toward the back surface.

* * * * *